United States Patent [19]

Nakasuji et al.

[11] Patent Number: 4,543,512
[45] Date of Patent: Sep. 24, 1985

[54] ELECTRON BEAM EXPOSURE SYSTEM

[75] Inventors: Mamoru Nakasuji, Yokohama; Hirotsugu Wada, Tokyo, both of Japan

[73] Assignee: Tokyo Shibaura Denki Kabushiki Kaisha, Kawasaki, Japan

[21] Appl. No.: 309,780

[22] Filed: Oct. 8, 1981

[30] Foreign Application Priority Data

Oct. 15, 1980 [JP] Japan ................................ 55-143946
Oct. 23, 1980 [JP] Japan ................................ 55-148693

[51] Int. Cl.4 ............................................. H01J 29/58
[52] U.S. Cl. .................................... 315/382; 250/397
[58] Field of Search ................ 315/382; 250/311, 397, 250/396 ML, 398

[56] References Cited

U.S. PATENT DOCUMENTS 3,576,438  4/1971  Pease .
3,644,700  2/1972  Kruppa et al. .
3,795,809  3/1974  Takashima .......................... 250/397
3,900,736  8/1975  Michail et al. .
4,020,343  4/1977  Shimaya et al. .
4,321,510  3/1982  Takigawa .......................... 250/397

FOREIGN PATENT DOCUMENTS 2731142   1/1978  Fed. Rep. of Germany .
55-131946 10/1980  Japan .
2007394    5/1979  United Kingdom .

OTHER PUBLICATIONS

S. Doran et al., Automatic Stabilization of an Electron-Probe Forming System, IBM, Sep. 1975, J. Vac. Sci. Technol., vol. 12, No. 6, Nov./Dec. 1975, p. 1174.
F. Kurzweil, Jr. et al., Automatic Control of an Electron-Beam Column, IBM.
Elektronik, vol. 8 (Aug. 1977), T. H. P. Chang et al., "Grundlagen und Technik der Elektronenstrahl-Lithografie," pp. 51-60.
IBM Journal of Research and Development, vol. 21, No. 6, (Nov. 1977), D. E. Davis et al., "Automatic Registration in an Electron-Beam Lithographic System," pp. 498-505.
H. C. Pfeiffer, Variable Spot Shaping for Electron-Beam Lithography, Proc. 14th EIP Symp., p. 883 (1978).

Primary Examiner—Theodore M. Blum
Attorney, Agent, or Firm—Oblon, Fisher, Spivak, McClelland & Maier

[57] ABSTRACT

An electron beam exposure system has first and second apertures through which is passed an electron beam emitted from an electron gun. A rectangular image formed by superposition of the images formed by the first and second apertures is projected onto a target plane through a third aperture by condenser lenses and projection lenses. When a crossover of the electron beam drifts in the direction perpendicular to the axis of the lens system, the current of the electron beam projected on the target plate decreases. The electron beam current is detected by a faraday cup, and the locus of the electron beam is corrected by a coil assembly interposed between the second and third apertures so that the faraday cup may detect the maximum beam current.

10 Claims, 4 Drawing Figures

ELECTRON BEAM EXPOSURE SYSTEM

BACKGROUND OF THE INVENTION

1. Field of the Invention

The present invention relates to an electron beam exposure system which is capable of correcting deviation of the electron beam path which is caused by drift of the crossover position.

2. Description of the Prior Art

An electron beam exposure system with which the shape and size of the electron beam spot may be varied has recently received a lot of attention. In this exposure system, the electron beam is projected through a first electron beam shaping aperture to form a first aperture image which is, in turn, projected through a second electron beam shaping aperture, so that the electron beam spot formed by superposition of both aperture images is formed on a target. The superposition of the two aperture images may be varied by deflecting the first aperture image. Therefore, the shape and size of the electron beam spot may be varied according to the degree of deflection.

When the crossover position of the electron beam drifts in an electron beam exposure system of this type, the target may not be exposed with a desired electron beam spot, and a correct circuit pattern may not be formed. When the crossover position drifts in the direction perpendicular to the axis of the electron optical column of the system, the axis of the electron optical column and the electron beam path are misaligned, and the electron lens exposure system becomes incapable of correctly controlling the electron beam. An electron beam exposure system has been proposed which has a servo controller for correcting the drift of the crossover position in the direction perpendicular to the axis of the electron optical column. In this electron beam exposure system, which are a faraday cup arranged in a lens barrel, the current of the electron beam passing through an aperture disposed at the crossover position is detected by a faraday cup arranged in a optical column, and alignment coil, which are arranged at the other crossover position are servocontrolled so that the electron beam current thus measured is maximized, thereby maintaining the magnification of the crossover image at the position of the coil at substantially 1. However, with this alignment control, since the crossover image is not an enlarged image at the position of the aperture, fine position deviation, that is, axial drift, may not effectively be detected. As a result, a large position deviation may be included in the enlarged crossover image formed by a projecting lens arranged at a later stage, and a stable beam intensity may not be obtained. Furthermore, when performing servocontrol for alignment, since the deflection center for alignment does not coincide with the beam shaping aperture position, the beam shape and size may fluctuate. Since the alignment servo controller is constantly in operation, the deflecting system is adversely affected. Since the faraday cup for measuring the electron beam current is supported by an electrical insulative member in the electron optical column, the charging of the insulative member makes the electron beam unstable.

In addition to the drift of the crossover position as described above, there is another type of drift in the crossover point position in the direction of the axis of the electron optical column when the cathode of the electron gun, e.g., a LaB6 tip, is heated for a long time interval and its front end shape changes, or when the electric power supplied for heating the electron gun changes. Since a deflecting center of a scanning deflector is generally set at the crossover position, this type of drift gives rise to a change in the degree of deflection of the aperture image of the electron beam, and hence, in the error in the size of the electron beam spot of the shape- and size-contolled electron beam, and in a deviation in the electron beam path when the beam size varies. However, this type of electron beam exposure system did not involve any countermeasures to these problems. Therefore, the conventional electron beam exposure systems lacked precision and reliability in the shape and size of the electron beam spot.

SUMMARY OF THE INVENTION

It is an object of the present invention to provide an electron beam exposure system with which a circuit pattern may be correctly drawn with an electron beam.

It is another object of the present invention to provide an electron beam exposure system which is capable of correcting the deviation of the electron beam path which is caused by drift in the crossover position of the electron beam.

The present invention provides an electron beam exposure system which is capable of correcting the drift of the crossover position formed by emission of the electron beam from an electron gun. According to an embodiment of the electron beam exposure system of the present invention, the deviation in the locus of the electron beam, which is caused when the crossover position drifts in the direction perpendicular to the axis of the electron optical column is corrected. When such a drift occurs, the current of the electron beam which reaches the target plane is reduced. An additional coil assembly is interposed between the beam shaping aperture and the projection lens for projecting the electron beam to the target plane to correct the locus of the electron beam so that the electron beam current may be kept to the maximum value. This allows better fine correction as compared with the case wherein a primary coil assembly is interposed between the beam shaping aperture and the electron gun to correct the beam locus.

According to another embodiment of the present invention, even when the crossover position formed in the electron lens system drifts in the direction of the axis of the electron optical column, deviation of the locus of the electron beam due to these drifts may be corrected. When the electron beam is deflected by the beam spot shaping deflector interposed between a first aperture and a second aperture, the image formed by the first aperture is displaced to vary the size and shape of the beam spot formed on the target plane by the superposition of both aperture images.

If the crossover image is located at the deflection center of the spot shaping deflector, the locations of the two sides of the beam spot on the target plane defined by the second aperture image do not fluctuate. However, when the crossover image is not located at the deflection center and the deflector operates, the locations of the two sides of the beam spot fluctuate. Accordingly, with the conventional electron beam exposure system, the focul length of a condenser lens is varied according to the location fluctuation of the two sides of the beam spot to form the crossover image on the deflection center.

DETAILED DESCRIPTION OF THE PREFERRED EMBODIMENTS

Figure 1:
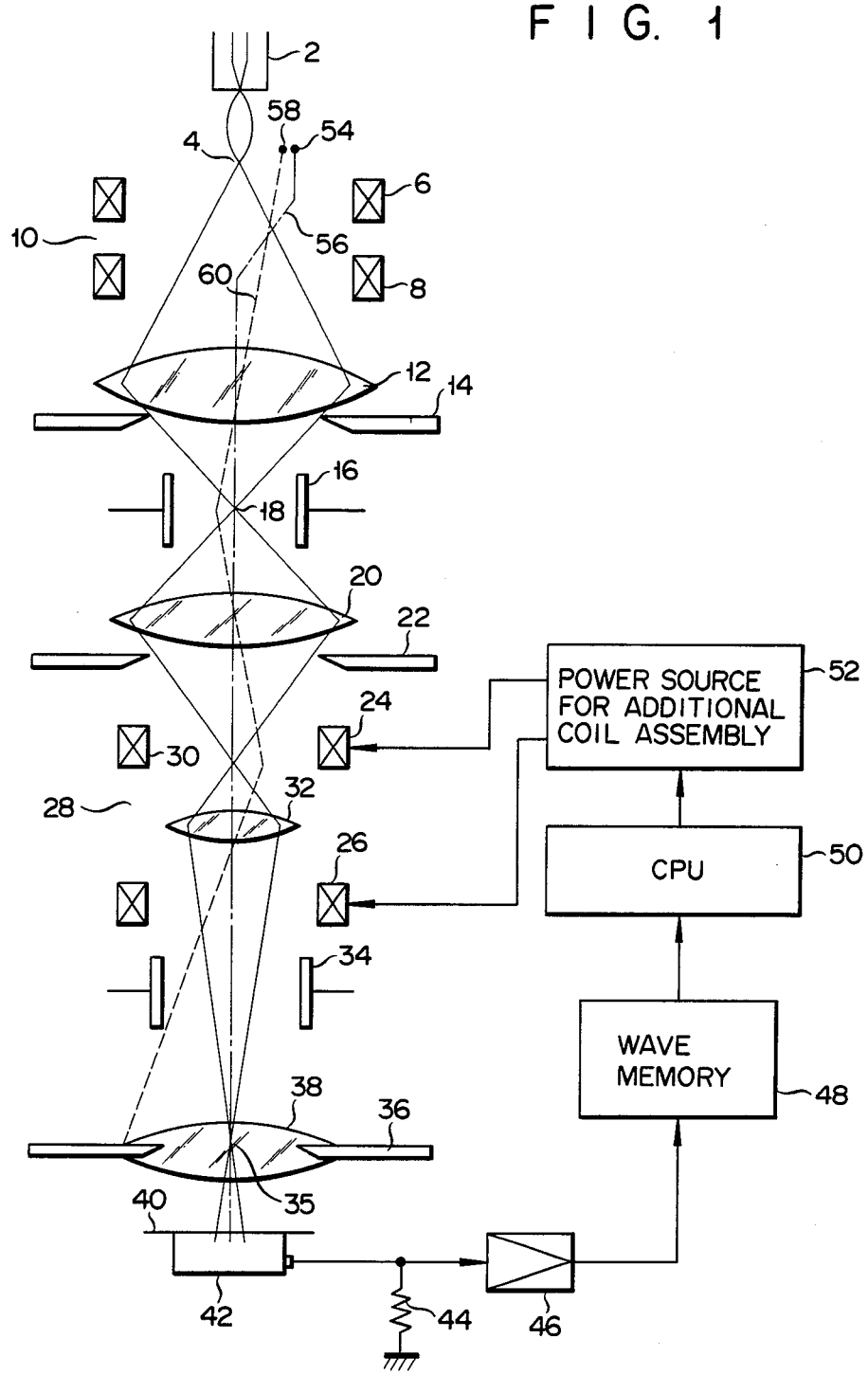
FIG. 1 is a schematic view showing an electron beam exposure system according to an embodiment of the present invention.

FIG. 1 is a schematic view showing an electron beam exposure system according to the first embodiment of the present invention. An electron beam is emitted from an electron gun 2 having a cathode made of LaB6. This electron beam forms a crossover 4 and is projected on a first condenser lens 12 through a space defined by a primary coil assembly 10 for initial alignment which includes first and second coils 6 and 8. The electron beam is focused by the first condenser lens 12, passing through a first spot shaping square aperture 14 for shaping the electron beam into a rectangular shape. The electron beam then forms a first crossover image 18 in a space defined by a spot shaping deflector 16 for deflecting the electron beam. The electron beam emerging from the space within the spot shaping deflector 16 is focused by a second condenser lens 20 and is projected through a second spot shaping square aperture 22. Since the image formed by the first spot shaping aperture 14 is projected through the second spot shaping square aperture 22, a rectangular image formed by the superpositions of the images of both apertures 14 and 22 is formed by an electron lens system at the stage following the second spot shaping square aperture 22. The electron beam which has passed the second spot shaping square aperture 22 is guided to a space defined by an additional coil assembly 28 for additional alignment, the coil assembly 28 including third and fourth coils 24 and 26. The electron beam is focused in this space to a second crossover image 30 and is projected by a demagnification lens 32. The electron demagnified by the lens 32 passes through a space defined by a spot scanning deflector 34 for deflecting the electron beam to scan the target (not shown in FIG. 1) with a beam spot. The electron beam is then guided to a projection lens 38 which is located at a third crossover image 35 formed by the electron beam and which has an aperture 36 which is equal to or larger than the crossover point 35. The projection lens 38 forms on a target plane 40 an electron beam spot which is obtained by demagnification of the third square image.

For additional alignment, a detection plane of a removal faraday cup 42 is located in place of the target at the target plane 40. At this faraday cut 42, the current of the electron beam landing on its detection plane is detected to generate a current signal. This current signal is converted to a voltage signal by a resistor 44 connected between the faraday cup 42 and ground and is supplied to an amplifier 46. The voltage signal amplified by the amplifier 46 is supplied to a wave memory 48, for example, a transient memory such as M-50E type available from Kawasaki Electronica K.K., to be stored therein. This wave memory 48 sequentially stores signals supplied thereto while the electron beam path is changed by the additional coil assembly 28 in a manner to be described later. The alignment data stored in the wave memory 48 is supplied to a CPU 50 which determines the conditions for alignment of the axis of the electron beam path and the axis of the electron optical column. These conditions are supplied as an instruction to a power source 52 for the additional coil assembly 28. In response to this instruction, the power source 52 supplies suitable electric power to the coils 24 and 26 of the assembly 28 to generate a correction magnetic field in the space defined by the coils 24 and 26. The axis of the electron beam path passing through this space is thus aligned with the axis of the electron optical column.

The mode of operation for performing the alignment of the axis of the electron beam path with the axis of the electron optical column will now be described in more detail with reference to the case when the crossover position 4 has drifted in the electron beam exposure system of the embodiment described above. In the initial alignment, if the first crossover 4 has drifted in the direction perpendicular to the axis of the electron optical column as denoted by reference numeral 54 as shown in FIG. 1, the crossover position 54 is apparently corrected by the primary coil assembly 10 to the position indicated by reference numeral 4. The axis of the path of the electron beam emerging from the crossover 54 is deflected in the direction of the axis of the system by the first coil 6 as shown by the alternate long and short dash line denoted by reference numeral 56 to be aligned with the axis of the system by the second coil 8. Therefore, the image of the crossover 54 is formed at the position shown by reference numeral 4 for the electron lens system of the stage following the primary coil assembly 10. Therefore, the axis of the electron beam path is aligned with the axis of the electron optical column so that the electron beam forms the crossover images 18, 30 and 35 and is correctly guided inside the faraday cup 42.

When this drift of the first crossover point is adjusted by the initial alignment but the first crossover continues to drift by changes with time of the electron gun 2, or when the adjustment of drift in the initial alignment is not sufficient, the additional coil assembly 28 corrects the drift of the first crossover point.

When the crossover drifts in the direction perpendicular to the axis of the barrel as shown by reference numeral 58 due to changes with time of the electron gun 2 or the like, the axis of the electron beam is deflected as shown by the broken line denoted by reference numeral 60 and is deviated from the axis of the electron optical column. Consequently, since the crossover image 35 is not formed at the aperture 36, the electron beam is prevented from passing through the aperture 36 and the current of the electron beam which reaches the faraday cup 42 decreases. Thus, when the position of the third crossover image 35 coincides with the center of the aperture 36, more of the electron beam reaches the faraday cup 42 and the electron beam current becomes maximum. This electron beam current decreases according to the magnitude of the drift. It is to be noted that a very small drift from the axis at the positions denoted by reference numerals 4 and 18 becomes a very big drift from the axis at the positions denoted by reference numerals 30 and 35. Therefore, if the electron beam is corrected at the positions denoted by reference numerals 30 and 35 at which the drift from the axis is great, alignment of the electron beam path may be correctly performed. This has been experimentally confirmed.

In the alignment by the additional coil assembly 28, data representing the relationship between the electron beam current and the electric power to be supplied to the coils 24 and 26 of the assembly 28 is collected. The electric power supplied to the third and fourth coils 24 and 26 from the power source 52 is changed, and the axis of the electron beam path is changed. As has been described, when the axis of the electron beams path changes, the electron beam current detected by the faraday cup 42 changes. Therefore, the relationship between the electron beam current and the electric power supplied to the coils 24 and 26 is stored in the wave memory 48. The CPU 50 selects the value of the electric power with which the electron beam current becomes maximum, and electric power of this value is supplied to the coils 24 and 26 to align the axis of the electron beam path with the axis of the electron optical column.

Since the coils 24 and 26 are located at later stages than the beam shaping apertures 14 and 22, changes in the electron beam path by the coils 24 and 26 will not change the superposition of the first and second beam shaping apertures and the size and shape of the third rectangular image and will not degrade the uniformity of illumination of the aperture 14. Since the fluctuation of the crossover of the electron beam has a long period, the additional alignment may be performed once or a plurality of times during exposure of a sample, and the control value thus obtained may be maintained thereafter. Of course, it is possible to perform the additional alignment at constant intervals. When such additional alignment is performed, since the center of the beam spot may be constantly effectively used, the fluctuation in the beam intensity due to the drift of the crossover point may be eliminated to less than 1%. Since it is only necessary to control the driving power of the coils 24 and 26 so as to make the electrol beam current detected by the faraday cup 42 maximum, the alignment procedure is very simple.

The present invention is not limited to the particular embodiment described above. For example, in place of the faraday cup, the dose of the electron beam may be detected by a sensor such as a cross metal wire or a semiconductor element. In addition, in place of the arithmetic control involving a wave memory which is advanced technology, it is also possible to incorporate a meter for measuring the dose of the electron beam to control the dose according to this measurement and to reduce the overall cost of the equipment. The configuration of the lenses in the electron lens barrel, the deflecting system and so on may be varied in numerous ways.

Figure 2:
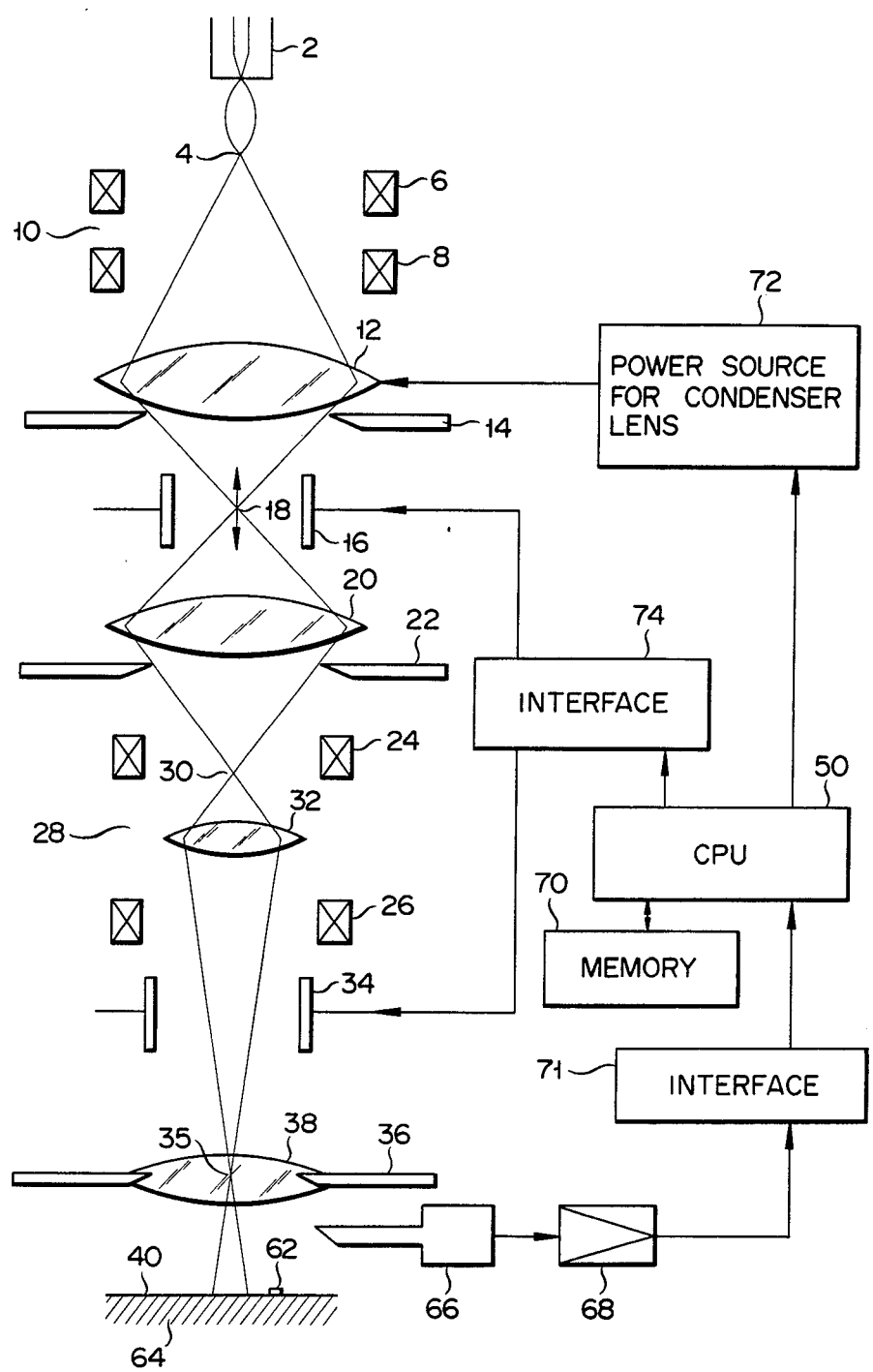
FIG. 2 is a schematic view showing an electron beam exposure system according to another embodiment of the present invention.

A description will now be made with reference to an electron beam exposure system which detects a drift of the crossover point 4 in the direction of the axis of the electron optical column, and which corrects this drift. Since the electron lens system shown in FIG. 2 is similar to the electron lens system shown in FIG. 1, the same reference numerals denote the same parts and the description thereof will be omitted. In the system shown in FIG. 2, at the target plane 40 is located a target 64 which has on its surface a detecting point 62 made of gold which reflects the electron beam. Above the detecting point 62 is located a reflective electron detector 66, such as a photocell, which detects electrons or secondary electrons emitted from the detecting point 62.

This detector 66 generates an electric signal upon reception of the electrons, which is amplified by an amplifier 68 to be supplied to the CPU through an interface 71. As will be described later, the CPU 50, according to the data stored in a memory 70, supplies a suitable instruction to a power source 72 to drive the condenser lens 12 and sets the focal length of the condenser lens 12 to a suitable value. The CPU 50 also may supply a voltage signal to the spot shaping deflector 16 and the spot scanning deflector 34 through an interface 74 so as to deflect the electron beam.

Figure 3:
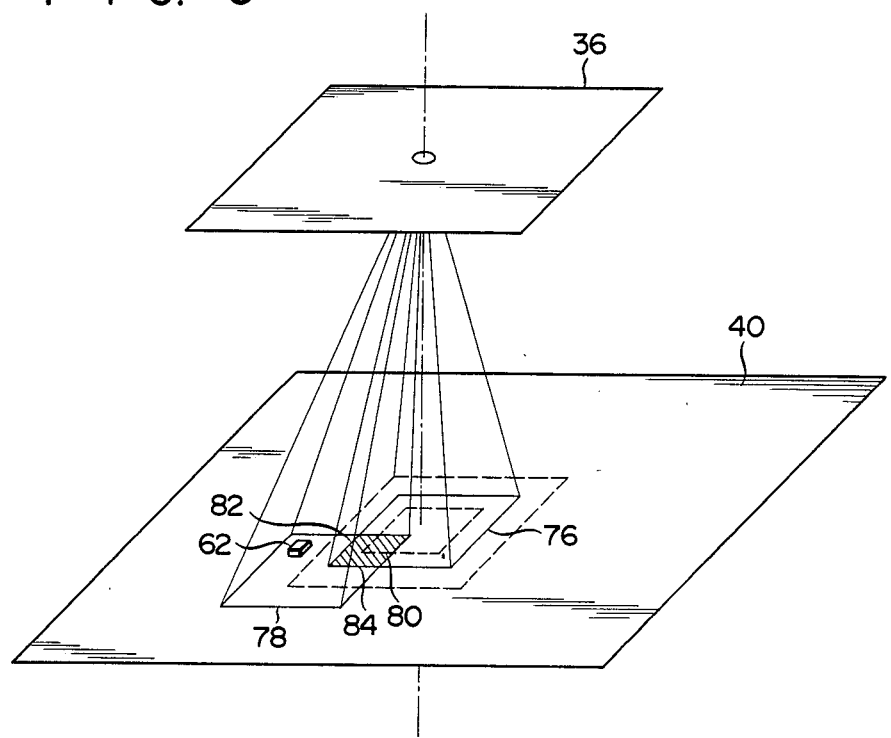
FIGS. 3 and 4 are schematic perspective views showing a beam spot formed by the electron beam exposure system shown in FIG. 2.

In the electron beam exposure system shown in FIG. 2, when the crossover 4 of the electron beam drifts in the axial direction of the electron optical column, the drift is detected and corrected in the manner to be described below. In general, when the crossover 4 is correctly formed at the predetermined position so that the first crossover point 18 is correctly formed at the deflection center of the spot shaping deflector 16, the size, shape and location of a second aperture image 76 formed by projecting the electron beam through the second aperture 22 on the target plane 40 as shown in FIG. 3 remain constant as long as the electron beam is not deflected by the spot scanning deflector 34. Although the second aperture image 76 is not actually formed on the target plane in practice, it is shown figuratively at the target plane in FIG. 3. In contrast with this, with a first aperture image 78 formed by projecting the electron beam through the first aperture 14 on the target plane 40, the size and shape do not generally change. However, when the electron beam is deflected by the spot shaping deflector 16, the location of the first aperture image 78 changes on the target plane 40 even if the electron beam is not deflected by the spot scanning deflector 34. As with the second aperture image 76, the first aperture image 78 formed through the first aperture is not actually formed on the target plane, but is figuratively shown in FIG. 3. In practice, a rectangular image 80 formed by the superposition of the two images 76 and 78 indicated by hatched lines in FIG. 3 is actually projected on the target plane 40. Since the size, shape and location of the second aperture image 76 remain constant, unless the electron beam is deflected by the spot scanning deflector 34, the location of two sides 82 and 84 of the rectangular image 80 do not change. However, if the crossover 4 drifts to cause the first crossover image 18 to drift from the deflection center of the deflector 16 in the axial direction thereof, when the electron beam is deflected by the spot shaping deflector 16 and the location of the first aperture image is changed, the second aperture image 76, which does not change under normal conditions, changes as shown by the broken line shown in FIG. 3. Thus, the locations of the two sides 82 and 84 of the square image 80 which do not change under normal conditions change. This has also been experimentally confirmed.

Figure 4:
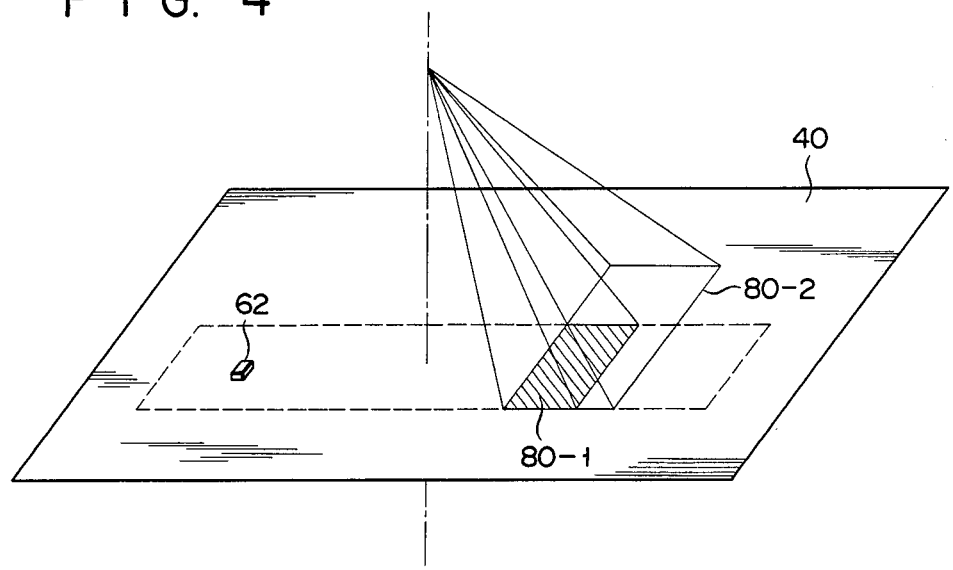

Considering the points described above, in the electron beam exposure system as shown in FIG. 2, the focal length of the condenser lens 12 is adjusted so that the locations of the two sides 82 and 84 of the square image 80 may not change even when the electron beam is deflected by the spot shaping deflector 16. The memory 70 stores in advance data representing the relationship between the focal length and a time fluctuation related to the location change, which is obtained in the manner described below. The electron beam is first deflected a certain value by the spot shaping deflector 16 to form a rectangular image 80-1 of predetermined shape and size on the target plane 40 as shown in FIG. 4. This rectangular image 80-1 is deflected by the spot scanning deflector to scan the target plane 40 with the rectangular image 80-1 as shown by the broken line in FIG. 4. Since the detecting point 62 is scanned, the detector 66 detects electrons and generates a signal. The detecting point 62 is scanned by the rectangular image 80-1 to obtain a time interval from the initiation of the scanning operation to the detecting time of the detecting point 62 by the detector 66. The time intervals thus obtained are averaged to obtain time data for the rectangular image 80-1. Subsequently, the electron beam is deflected by the spot shaping deflector to vary the size and shape of the rectangular image 80-1 as shown in FIG. 4 to form a rectangular image 80-2. A time interval for the rectangular image 80-2 is also obtained in a similar manner. The time interval required for either of the sides 82 and 84 of the rectangular image 80-1 to reach the detecting point 62, and the time interval required for either of the sides 82 and 84 of the rectangular image 80-2 to reach the detecting point 62, remain constant under normal conditions. However, when the second crossover image 18 is not correctly located at the deflection center of the deflector, both their time intervals vary. Such time fluctuations are recorded for the case wherein the focal length of the condenser lens 12 is changed by the power source 72. The relationship between the time fluctuation and the focal length of the condenser lens 12 which is required to compensate for such a time fluctuation is stored in the memory 70 in advance. Subsequently, prior to the exposure of the target with the electron beam, unnecessary regions of the target 64 are scanned by the images 80-1 and 80-2 of different sizes and time fluctuations are measured in the interface 71 and are supplied to the CPU 50. The CPU 50 selects the focal length of the condenser lens 12 corresponding to the particular time fluctuation from the data stored in the memory 70, and supplies an instruction corresponding to the focal length to the power source 72. As a result, the condenser lens 12 is drived by the power source 72 to have a predetermined focal length, so that the position of the first crossover image 18 is corrected, and the circuit pattern may be drawn on the target 64 with the rectangular image of correct size and shape.

In place of the condenser lens 12, the size and shape of the square image 80 may be corrected by the spot shaping deflector 16 or the spot scanning deflector 34. If the size and shape of the image 80 do not match the correct size and shape due to the drift of the first crossover image 18 when the size and shape of the square image 80 are changed, the size and shape of the image 80 may be corrected by the deflectors 16 and 34 in correspondence with the errors in the actual and required sizes and shapes. For this purpose, the relationship between the error and correction amount is stored in the wave memory 70. In this case, the correction amount is obtained according to the detected error, and the CPU 50 may supply a suitable voltage signal to the deflectors 16 and 34 through the interface 74. Correction of the drift of the second crossover point 18 with the deflectors 16 and 34 may be performed faster and with better response than the correction with the condenser lens 12.

In summary, according to the electron beam exposure system of the present invention, the error in the degree of deflection due to axial drift of the crossover point, and errors in the setting precision of the size and shape of the beam spot of the scanning position may be effectively corrected. This allows electron beam exposure of high precision when combined with conventional alignment control. According to the system of the present invention, the axial drift of the crossover point may be automatically corrected by the feedback mechanism, and the system may thus be operated with excellent reliability.

The present invention is not limited to the particular embodiments described above. For example, the number of lenses or control systems may be determined according to particularly desired specifications. Various other modifications and changes may thus be made within the spirit and scope of the present invention.

What we claim is:

1. An electron beam exposure system having an electron optical column defining an axis, comprising:
   an electron gun for emitting an electron beam and forming a crossover of the electron beam;
   a first aperture for shaping a sectional shape of the electron beam emitted from said electron gun into a predetermined shape;
   means for converging the electron beam passed through said first aperture to form a crossover image;
   a second aperture to which is projected the electron beam emerging from the crossover image;
   means interposed between said first and second apertures for deflecting the electron beam, said deflecting means having the crossover image and a deflection center in a space defined thereby;
   means for projecting the electron beam passed through said second aperture onto a target plane to form a beam spot of rectangular shape by superposition of images by said first and second apertures;
   means for detecting a fluctuation of at least one of two sides of the beam spot defined by the image of said second aperture in a direction perpendicular to the axis of the electron optical column when said deflecting means deflects the electron beam to change a size of the rectangular beam spot; and
   means for driving said converging means according to the detected fluctuation to reduce the fluctuation.

2. A system according to claim 1, wherein said detecting means includes,
   a detection point for reflecting electrons which is disposed on the target plane; and
   a detector for detecting the electrons reflected by said detecting point.

3. A system according to claim 1, wherein said projecting means includes means for deflecting said electron beam to scan the target plane with the beam spot.

4. A system according to claim 1, wherein said converging means comprises a condenser lens having a variable focal length.

5. A system according to claim 4, wherein said driving means includes,
   a power source for supplying variable electric power to said condenser lens; and
   means for selecting electric power corresponding to the fluctuation, the focal length of said condenser lens being set by said power source thereby forming the crossover image on the deflection center.

6. An electron beam exposure system having a electron optical column defining an axis, comprising:
   an electron gun for emitting an electron beam and forming a crossover of the electron beam;

a first aperture for shaping a sectional shape of the electron beam emitted from said electron gun into a predetermined shape;

means for converging the electron beam passed through said first aperture to form a crossover image;

a second aperture to which is projected the electron beam emerging from the crossover image;

means interposed between said first and second apertures for deflecting the electron beam, said deflecting means having the crossover image and a deflection center in a space defined thereby;

means for projecting the electron beam passed through said second aperture onto a target plane to form a beam spot of rectangular shape by superposition of images by said first and second apertures;

means for detecting a fluctuation of at least one of two sides of the beam spot defined by the image of said second aperture in a direction perpendicular to the axis of the electron optical column, when said deflecting means deflects the electron beam to change a size of the rectangular beam spot; and means for driving said deflecting means according to the detected fluctuation to reduce the fluctuation.

7. A system according to claim 6, wherein said detecting means includes, a detecting point for reflecting electrons which is disposed on said target plane; and a detector for detecting the electrons reflected by said detecting point.

8. A system according to claim 6, wherein said projecting means includes means for scanning the target plane with the beam spot.

9. A system according to claim 8, wherein said scanning means is driven according to the detected fluctuation.

10. A system according to claim 6, wherein said converging means comprises a condenser lens having a variable focal length.

* * * * *